US007763943B2

(12) United States Patent
Pillarisetty et al.

(10) Patent No.: US 7,763,943 B2
(45) Date of Patent: Jul. 27, 2010

(54) REDUCING EXTERNAL RESISTANCE OF A MULTI-GATE DEVICE BY INCORPORATION OF A PARTIAL METALLIC FIN

(75) Inventors: Ravi Pillarisetty, Portland, OR (US); Uday Shah, Portland, OR (US); Titash Rakshit, Hillsboro, OR (US); Jack T. Kavalieros, Portland, OR (US); Brian S. Doyle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 205 days.

(21) Appl. No.: 11/964,623

(22) Filed: Dec. 26, 2007

(65) Prior Publication Data
US 2009/0166742 A1 Jul. 2, 2009

(51) Int. Cl.
*H01L 29/76* (2006.01)
*H01L 29/94* (2006.01)
*H01L 31/062* (2006.01)

(52) U.S. Cl. .............................. 257/365; 257/E21.421; 257/E29.264

(58) Field of Classification Search ................. 257/365, 257/E21.421, E21, 425, E29.264, E29.275, 257/E29.271; 438/283
See application file for complete search history.

(56) References Cited

U.S. PATENT DOCUMENTS

| 6,617,209 | B1 | 9/2003 | Arghavani et al. |
| 6,617,210 | B1 | 9/2003 | Chau et al. |
| 6,653,700 | B2 | 11/2003 | Chau et al. |
| 6,696,327 | B1 | 2/2004 | Chau et al. |
| 6,696,345 | B2 | 2/2004 | Chau et al. |
| 6,713,358 | B1 | 3/2004 | Chau et al. |
| 6,812,086 | B2 | 11/2004 | Murthy et al. |
| 6,825,506 | B2 | 11/2004 | Chau et al. |
| 6,858,478 | B2 | 2/2005 | Doyle et al. |
| 6,887,800 | B1 | 5/2005 | Metz et al. |
| 6,890,807 | B2 | 5/2005 | Chau et al. |
| 6,893,927 | B1 | 5/2005 | Chau et al. |
| 6,897,134 | B2 | 5/2005 | Chau et al. |
| 6,914,295 | B2 | 7/2005 | Doyle et al. |
| 6,933,589 | B2 | 8/2005 | Murthy et al. |
| 6,939,815 | B2 | 9/2005 | Chau et al. |

(Continued)

OTHER PUBLICATIONS

Chau, Robert S., et al., "High Mobility Tri-Gate Devices and Methods of Fabrication", U.S. Patent Application filed Jan. 12, 2006 assigned U.S. Appl. No. 11/332,189.

(Continued)

*Primary Examiner*—David S Blum
(74) *Attorney, Agent, or Firm*—Cool Patent, P.C.; Joseph P. Curtin

(57) ABSTRACT

Reducing external resistance of a multi-gate device by incorporation of a partial metallic fin is generally described. In one example, an apparatus includes a semiconductor substrate and one or more fins of a multi-gate transistor device coupled with the semiconductor substrate, the one or more fins having a gate region, a source region, and a drain region, the gate region being disposed between the source and drain regions where the gate region of the one or more fins includes a semiconductor material and where the source and drain regions of the one or more fins include a metal portion and a semiconductor portion, the metal portion and the semiconductor portion being coupled together.

12 Claims, 3 Drawing Sheets

U.S. PATENT DOCUMENTS

| | | | |
|---|---|---|---|
| 6,952,040 | B2 | 10/2005 | Chau et al. |
| 6,974,764 | B2 | 12/2005 | Brask et al. |
| 6,998,686 | B2 | 2/2006 | Chau et al. |
| 7,005,366 | B2 | 2/2006 | Chau et al. |
| 7,037,845 | B2 | 5/2006 | Chau et al. |
| 7,042,009 | B2 | 5/2006 | Shaheen et al. |
| 7,045,428 | B2 | 5/2006 | Brask et al. |
| 7,071,064 | B2 | 7/2006 | Doyle et al. |
| 7,074,680 | B2 | 7/2006 | Doczy et al. |
| 7,084,038 | B2 | 8/2006 | Doczy et al. |
| 7,105,390 | B2 | 9/2006 | Chau et al. |
| 7,148,548 | B2 | 12/2006 | Doczy et al. |
| 7,153,734 | B2 | 12/2006 | Brask et al. |
| 7,153,784 | B2 | 12/2006 | Brask et al. |
| 7,157,378 | B2 | 1/2007 | Brask et al. |
| 7,160,767 | B2 | 1/2007 | Brask et al. |
| 7,160,779 | B2 | 1/2007 | Doczy et al. |
| 7,166,505 | B2 | 1/2007 | Arghavani et al. |
| 7,176,075 | B2 | 2/2007 | Jin et al. |
| 7,176,090 | B2 | 2/2007 | Brask et al. |
| 7,180,109 | B2 | 2/2007 | Jin et al. |
| 7,183,184 | B2 | 2/2007 | Doczy et al. |
| 7,208,361 | B2 | 4/2007 | Shah et al. |
| 7,220,635 | B2 | 5/2007 | Chau et al. |
| 7,223,679 | B2 | 5/2007 | Murthy et al. |
| 7,268,058 | B2 | 9/2007 | Jin et al. |
| 2004/0007724 | A1 | 1/2004 | Murthy et al. |
| 2004/0036126 | A1 | 2/2004 | Chau et al. |
| 2004/0048424 | A1* | 3/2004 | Wu et al. ............ 438/154 |
| 2005/0269644 | A1 | 12/2005 | Brask et al. |
| 2005/0272191 | A1 | 12/2005 | Shah et al. |
| 2005/0287748 | A1 | 12/2005 | Kavalieros et al. |
| 2006/0202266 | A1* | 9/2006 | Radosavljevic et al. ..... 257/344 |
| 2007/0029627 | A1 | 2/2007 | Datta et al. |
| 2007/0287255 | A1 | 12/2007 | Doyle et al. |
| 2008/0003755 | A1 | 1/2008 | Shah et al. |

OTHER PUBLICATIONS

Chau, Robert S., et al., "A CMOS Device With Metal and Silicide Gate Electrodes and a Method for Making It", U.S. Patent Application filed Nov. 2, 2006 assigned U.S. Appl. No. 11/556,025.

Chau, Robert S., et al., "Replacement Metal Gate/High K Dielectric Scheme for FIN-FET Transistors", U.S. Patent Application filed Nov. 21, 2007 assigned U.S. Appl. No. 11/986,510.

Kavalieros, Jack T., et al., "An Apparatus and Method for Selectively Recessing Spacers on Multi-Gate Devices", U.S. Patent Application filed Sep. 15, 2006 assigned U.S. Appl. No. 11/521,624.

Singh, Rajwinder et al., "Method of Forming a Selective Spacer in a Semiconductor Device", U. S. Patent Application filed Dec. 29, 2006 assigned U.S. Appl. No. 11/648,512.

Doyle, Brian S., et al., "Multi-Gate Structure and Method of Doping Same", U.S. Patent Application filed Mar. 28, 2007 assigned U.S. Appl. No. 11/729,198.

Rachmady, Willy et al., "High K Dielectric Materials Integrated Into Multi-Gate", U.S. Patent Application filed Jun. 19, 2007 assigned U.S. Appl. No. 11/765,023.

Ban, Ibrahim et al., "Localized Spacer for a Multi-Gate Transistor", U.S. Patent Application filed Mar. 28, 2007 assigned U.S. Appl. No. 11/729,033.

* cited by examiner

REDUCING EXTERNAL RESISTANCE OF A MULTI-GATE DEVICE BY INCORPORATION OF A PARTIAL METALLIC FIN

BACKGROUND

Generally, multi-gate devices or non-planar transistors such as tri-gate devices are emerging as a viable option to support future technology scaling.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
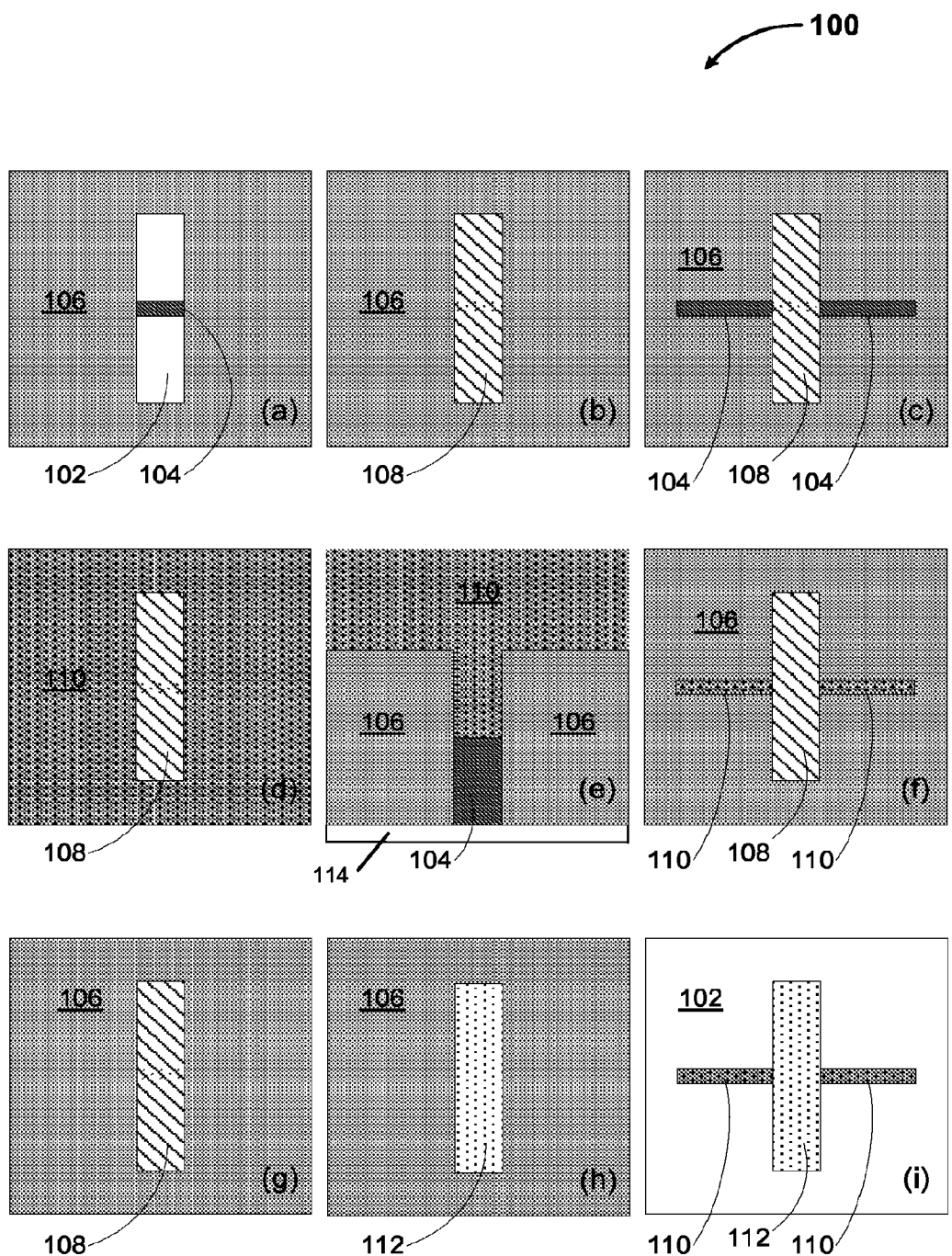
FIG. 1 is a process schematic for reducing external resistance of a multi-gate device by incorporation of a partial metallic fin, according to but one embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of reducing external resistance of a multi-gate device by incorporation of a partial metallic fin are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIG. 1 is a process schematic for reducing external resistance of a multi-gate device by incorporation of a partial metallic fin, according to but one embodiment. FIGS. 1a-d and FIGS. 1f-i include top-down representations while FIG. 1e is a cross-section representation. Although the depictions are represented sequentially (i.e. a through i), other sequences may be readily apparent and/or may fall within the spirit and scope of this description. In other words, the description is not limited to the particular sequence depicted in FIG. 1.

Multi-gate transistors or non-planar transistors 100, such as tri-gate devices, may emerge as an option to support future technology scaling of transistor devices. However, drive current in multi-gate devices may be severely hindered by parasitic resistance. The parasitic resistance may result from difficulty in forming low interfacial resistance between epitaxial growth (epi) and fin 104 surfaces (i.e. —sidewalls). For example, sidewall spacer dielectric may block epi growth along the sides of the fin 104. This may result in forming a low resistance contact only on a portion of the fin 104 that is not impeded by the spacer dielectric, for example. Such effect may bottleneck the flow of current into the fin 104, resulting in a degradation of external resistance ($R_{ext}$) of the multi-gate transistor.

Embodiments disclosed herein include at least a structure and a process to partially replace semiconductor material in the source/drain regions of a multi-gate fin with an electrically conductive metal. The relatively higher conductivity of the metal compared to the semiconductor material may significantly alleviate the $R_{ext}$ degradation corresponding with an improvement in drive current.

In an embodiment according to FIG. 1a, an apparatus 100 comprises a shallow trench isolation (STI) material 102, one or more multi-gate fins 104, and a hardmask dielectric film 106, each coupled as shown. The one or more multi-gate fins 104 may be referred to as diffusion according to an embodiment and may include doped silicon. The portion of fin 104 seen in FIG. 1a may be a gate region. In an embodiment, one or more multi-gate fins 104 are coupled with an underlying semiconductor substrate 114 (FIG. 1). The ST1 material 102 may be deposited to the semiconductor substrate and the hardmask dielectric film 106 may be deposited to the ST1 material 102 and also deposited to a source and drain region (underlying the hardmask dielectric in this schematic) of the one or more fins 104. The deposited hardmask dielectric film 106 may be patterned to provide a structure similar to FIG. 1a. In an embodiment, FIG. 1a represents a topdown view of a replacement metal gate (RMG) tri-gate flow after oxide 106 planarization and sacrificial poly stack liftout.

In an embodiment according to FIG. 1b, an apparatus 100 comprises a sacrificial dielectric 108 coupled with the hardmask dielectric film 106, the STI material 102, and the one or more multi-gate fins 104 of FIG. 1a, as shown. In an embodiment, the sacrificial dielectric 108 comprises nitride such as silicon nitride, for example. In other embodiments, the sacrificial dielectric 108 comprises any suitable etch-selective material compatible with techniques described herein. The sacrificial dielectric 108 may serve to define the location where the gate electrode will be deposited and/or protect the fin material from being etched in the "channel" region or gate region, which may be the portion of the semiconductor fin 104 that lies under the gate electrode. In an embodiment, the sacrificial dielectric 108 is polished back to the level of the hardmask dielectric film 106.

In an embodiment according to FIG. 1c, an apparatus 100 includes one or more multi-gate fins 104, hardmask dielectric 106, and sacrificial dielectric 108, each coupled as shown. FIG. 1c may be a depiction of FIG. 1b after the hardmask dielectric 106 has been recessed down to the semiconductor fin 104 level, by etching for example. Hardmask dielectric 106 is recessed by using a timed wet etch, in one embodiment. The portions of semiconductor fin 104 visible in FIG. 1c include the source and drain regions 104, in an embodiment. In another embodiment, the semiconductor material in the source and drain regions 104 of the multi-gate fin is partially removed by etching, for example. Fin material in the gate region (i.e. —104 in FIG. 1a) may be protected from etching by the sacrificial dielectric 108. The source and drain regions of one or more semiconductor fins 104 may be partially replaced by an electrically conductive material such as metal in FIGS. 1d-f.

In an embodiment according to FIG. 1d, an apparatus 100 includes sacrificial dielectric 108 and metal film 110, each coupled as shown. FIG. 1d may be a depiction of FIG. 1c after the semiconductor material of the fin 104 in the source and drain regions has been partially removed by etching and a metal film 110 has been deposited to replace the removed semiconductor material, the metal film 110 being subsequently polished or planarized back to the sacrificial dielectric 108. In an embodiment, the metal 110 includes aluminum, titanium, cobalt, gold, silver, platinum, nickel, or suitable combinations. In another embodiment, the metal 110 includes electrically conductive alloys. In yet another embodiment, an electrically conductive material 110 that is more conductive than the replaced semiconductor material is used to reduce parasitic capacitance in a tri-gate device. The electrically conductive material 110 may be deposited by any suitable method including chemical vapor deposition (CVD), physical vapor deposition (PVD), atomic layer deposition (ALD), or suitable combinations.

In an embodiment according to FIG. 1e, which is a cross-section view through the source or drain region of FIG. 1d, an apparatus 100 includes remaining semiconductor fin material 104, hardmask dielectric 106, and replacement metal 110, each coupled as shown. In an embodiment, the remaining semiconductor fin material 104 in the source/drain regions and the replacement metal 110 are annealed to facilitate good interfacial resistance between the metal 110 and remaining semiconductor fin material 104. Annealing may decrease interfacial resistance.

In an embodiment according to FIG. 1f, an apparatus 100 includes a hardmask dielectric 106, sacrificial dielectric 108 and metallic portions 110 of one or more multi-gate fins. FIG. 1f may be a depiction of FIG. 1d after recessing the metal 110 back to the level of the dielectric hardmask 106. In an embodiment, the metal film 110 is recessed using a timed etch. The metal 110 recess may be selective to the sacrificial dielectric 108, leaving the hardmask dielectric 106 and metallic fins 110 recessed in comparison to the sacrificial dielectric 108.

In an embodiment according to FIG. 1g, an apparatus 100 includes additional hardmask dielectric 106 and sacrificial dielectric 108, each coupled as shown. FIG. 1g may be a depiction of FIG. 1f after additional hardmask dielectric 106 deposition and polish of the additional hardmask dielectric 106 back to the sacrificial dielectric 108.

In an embodiment according to FIG. 1h, an apparatus 100 includes the hardmask dielectric 106 of FIG. 1g and gate stack 112. FIG. 1h may be a depiction of FIG. 1g after sacrificial dielectric 108 liftout and gate stack 112 formation. Sacrificial dielectric 108 may be removed by etching. In an embodiment, sacrificial dielectric 108 comprising nitride is etched out using a nitride hardmask etch selective to spacer nitride. Gate stack 112 formation may be accomplished by depositing a gate dielectric to the gate region of the multi-gate fin 104, depositing a first gate electrode such as a gate metal to the gate dielectric, and depositing a second gate electrode such as polysilicon to the first gate electrode. In an embodiment, the gate stack 112 is polished back to the hardmask dielectric 106 of FIG. 1g.

In an embodiment according to FIG. 1n, an apparatus 100 includes STI material 102, one or more metallic fins 110, and gate stack 112, each coupled as shown. FIG. 1i may be a depiction of FIG. 1h after recessing the dielectric hardmask 106 down to the STI 102 level. Recessing the dielectric hardmask 106 may be accomplished by etching. In an embodiment, the source and drain regions of the multi-gate fin 110 include a semiconductor portion underlying the visible metallic portion 110 to prevent or reduce current leakage to the semiconductor substrate.

In an embodiment, an apparatus 100 includes one or more fins 110 of a multi-gate transistor device, the one or more fins having a gate region (i.e., —the region of fin 110 underlying gate stack 112 in FIG. 1i), a source region, and a drain region (i.e., —the visible regions of fin 110 in FIG. 1i), the gate region being disposed between the source and drain regions, and a gate stack 112 coupled with the gate region of the one or more fins. In one embodiment, the gate region includes a semiconductor material. In another embodiment, the gate region of the one or more multi-gate fins includes only semiconductor material and substantially no metal (i.e., —the fin 104 visible in FIG. 1a). The semiconductor material in the gate region includes silicon in an embodiment. In an embodiment, the source and drain regions include a metal portion and a semiconductor portion (i.e., —the fin made of semiconductor portion 104 and metal 110 in FIG. 1i, also depicted in FIG. 1e where the fin is disposed between hardmask dielectric 106), the metal portion and the semiconductor portion being coupled together. In an embodiment, the semiconductor portion includes silicon.

In an embodiment, a semiconductor substrate (not shown) is coupled with the one or more multi-gate fins 110. In another embodiment, the semiconductor substrate is coupled to the semiconductor portion 104 of the source and drain regions of the one or more fins to reduce current leakage to the semiconductor substrate in a multi-gate device. For example, in an embodiment according to FIG. 1e, the semiconductor portion 104 is coupled with the semiconductor substrate, while the metallic portion 110 forms the top part of the fin (i.e. —the metal portion 110 in FIG. 1i, which is a top-down view). The metal portion 110 of the source and drain regions may be disposed, in this regard, to reduce parasitic contact resistance in the multi-gate transistor device by increasing electrical conductivity in the source and drain regions. In an embodiment, the metal portion 110 is formed by a replacement process as disclosed, the metal portion 110 including aluminum, titanium, cobalt, gold, silver, platinum, nickel, or combinations thereof, including alloys.

In an embodiment, the gate stack 112 includes a gate dielectric film coupled with the one or more fins, a first gate electrode coupled with the gate dielectric film, and a second gate electrode coupled with the first gate electrode. In an embodiment, the first gate electrode includes a gate metal and the second gate electrode comprises polysilicon. Other suitable replacement materials may be used for first and second gate electrodes.

A multi-gate transistor device using one or more fins 104, 110 in accordance with embodiments described herein may be a tri-gate device such as a u-shaped transistor, for example, that demonstrates reduced $R_{ext}$ in comparison to a tri-gate device having only the semiconductor material in the source and drain regions.

Figure 2:
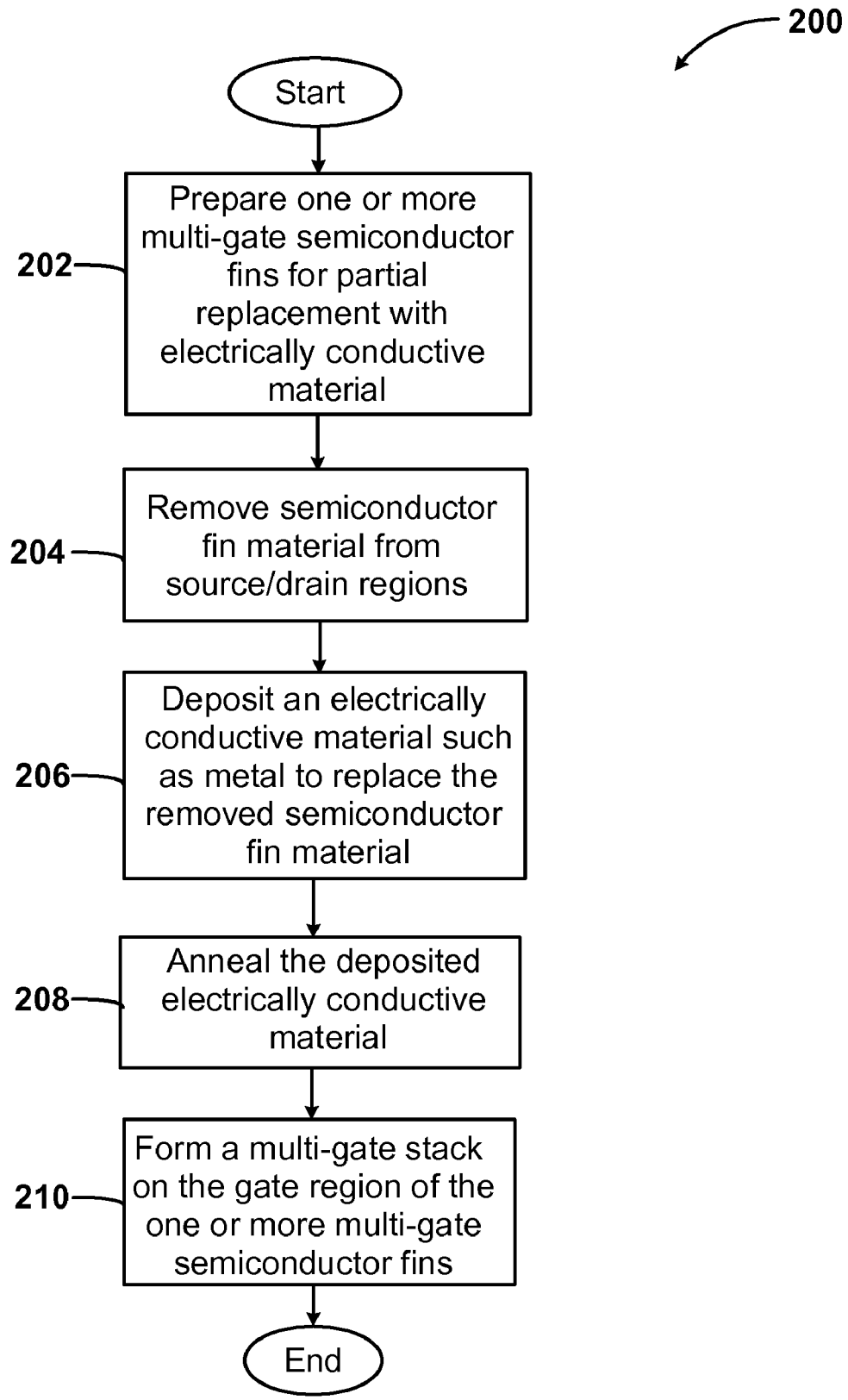
FIG. 2 is a flow diagram of a method for reducing external resistance of a multi-gate device by incorporation of a partial metallic fin, according to but one embodiment.

FIG. 2 is a flow diagram of a method for reducing external resistance of a multi-gate device by incorporation of a partial metallic fin, according to but one embodiment. In an embodiment, a method 200 includes preparing one or more multi-gate semiconductor fins for partial replacement with electrically conductive material at box 202, removing semiconductor fin material from source/drain regions at box 204, depositing an electrically conductive material such as metal to replace the removed semiconductor fin material at box 206, annealing the deposited electrically conductive material at box 208, and forming a multi-gate stack on the gate region of the one or more multi-gate semiconductor fins at box 210. Embodiments disclosed with respect to FIG. 1 may be incorporated into a method 200 in one or more embodiments.

In an embodiment, a method 200 includes preparing one or more multi-gate fins including semiconductor material for partial replacement with a metal 202, the one or more multi-gate fins having a gate region, a source region, and a drain region, the gate region being disposed between the source and drain regions, removing a portion of the semiconductor material from the source and drain regions of the one or more multi-gate fins 204, and replacing the removed semiconductor material with a metal to reduce parasitic contact resistance in a multi-gate transistor device by increasing electrical conductivity in the source and drain regions 206.

Preparing one or more multi-gate semiconductor fins for partial replacement 202 may include depositing a hardmask dielectric film to the source and drain regions of the one or more multi-gate fins and polishing the hardmask dielectric film to a pre-determined thickness. A pre-determined thickness may vary according to device requirements or other dielectric requirements of the hardmask dielectric film. A hardmask dielectric film may include an oxide such as silicon oxide, in one example. Such preparation 202 may result in a structure similar to that depicted in FIG. 1a, for example. Preparing 202 may further include depositing a sacrificial dielectric to the gate region of the one or more multi-gate fins and to the hardmask dielectric film, and polishing the sacrificial dielectric back to the hardmask dielectric film such that the sacrificial dielectric remains coupled to the gate region and does not remain coupled to the hardmask dielectric film (i.e. —as depicted in FIG. 1b). A sacrificial dielectric may include a nitride such as silicon nitride, for example. Preparing 202 may further include etching the hardmask dielectric film to expose the semiconductor material of the one or more multi-gate fins in the source and drain regions (i.e. —as depicted in FIG. 1c).

Removing a portion of the semiconductor material from the source and drain regions of the one or more multi-gate fins 204 may include etching out a portion of the semiconductor material from the source and drain regions. The semiconductor material of the gate region may be protected from the etching by a sacrificial dielectric coupled with the gate region (i.e. —as depicted in FIG. 1c).

Replacing the removed semiconductor material with a metal 206 may include depositing aluminum, titanium, cobalt, gold, silver, platinum, nickel, or suitable combinations thereof. Replacing the removed semiconductor material with a metal 206 may include depositing an electrically conductive metal film to replace the removed semiconductor material in the source and drain regions of the one or more multi-gate fins and polishing the deposited metal film back to a sacrificial dielectric coupled with the gate region of the one or more multi-gate fins (i.e. —as depicted in FIG. 1d).

In an embodiment, replacing the removed semiconductor material with a metal 206 further includes annealing the deposited metal 208 and the remaining semiconductor material in the source and drain regions of the one or more multi-gate fins to decrease interfacial resistance between the deposited metal and the remaining semiconductor material. Replacing the removed semiconductor material with a metal 206 may further include etching to recess the deposited metal back to a hardmask dielectric film coupled with the source and drain regions of the one or more multi-gate fins such that the deposited metal remains only in the source and drain regions of the one or more multi-gate fins (i.e. —as depicted in FIG. 1f). Replacing the removed semiconductor material with a metal 206 may also include depositing additional dielectric material to the hardmask dielectric film and polishing the additional dielectric material back to the level of the sacrificial dielectric (i.e. —as depicted in FIG. 1g). The sacrificial dielectric may be removed to allow for subsequent gate formation in the gate region.

Forming a multi-gate stack on the gate region of the one or more multi-gate fins 210 may include depositing a gate dielectric material to the gate region of the one or more multi-gate fins and depositing a first gate electrode to the gate dielectric. In another embodiment, a second gate electrode is deposited to the first gate electrode. In an embodiment, a first gate electrode includes any suitable gate electrode material. A first gate electrode may be a gate metal, for example. In another embodiment, a second gate electrode includes any suitable gate electrode material. A second gate electrode may be polysilicon, for example.

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 3:
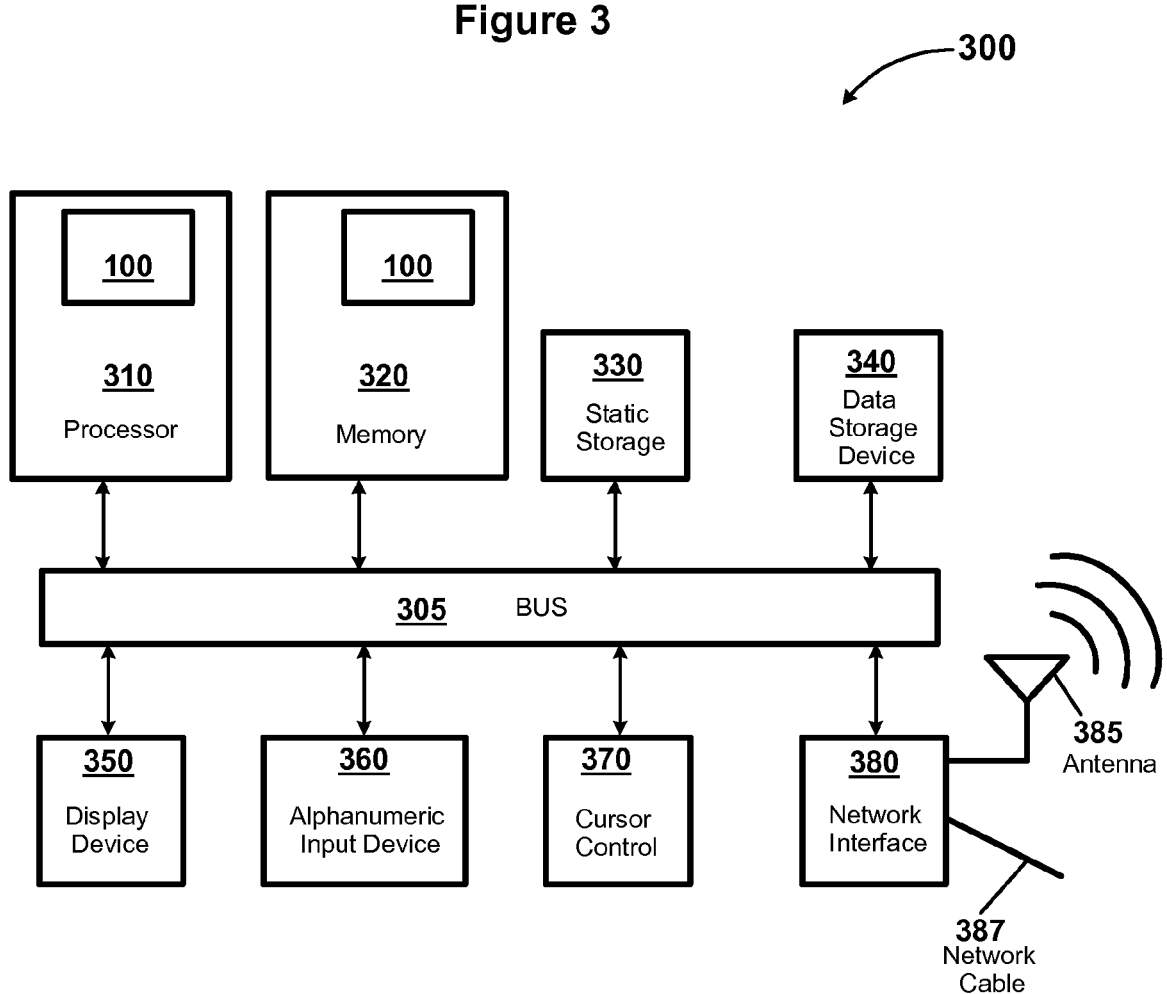
FIG. 3 is a diagram of an example system in which embodiments of the present invention may be used, according to but one embodiment.

FIG. 3 is a diagram of an example system in which embodiments of the present invention may be used, according to but one embodiment. System 300 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 300 includes an apparatus having a partial metallic fin 100 in accordance with embodiments described with respect to FIGS. 1-2. In an embodiment, an apparatus having a partial metallic fin 100 as described herein is part of an electronic system's processor 310 or memory 320.

Electronic system 300 may include bus 305 or other communication device to communicate information, and processor 310 coupled to bus 305 that may process information. While electronic system 300 may be illustrated with a single processor, system 300 may include multiple processors and/or co-processors. In an embodiment, processor 310 includes an apparatus having a partial metallic fin 100 in accordance with embodiments described herein. System 300 may also include random access memory (RAM) or other storage device 320 (may be referred to as memory), coupled to bus 305 and may store information and instructions that may be executed by processor 310.

Memory 320 may also be used to store temporary variables or other intermediate information during execution of instructions by processor 310. Memory 320 is a flash memory device in one embodiment. In another embodiment, memory 320 includes an apparatus having a partial metallic fin 100 as described herein.

System 300 may also include read only memory (ROM) and/or other static storage device 330 coupled to bus 305 that may store static information and instructions for processor 310. Data storage device 340 may be coupled to bus 305 to store information and instructions. Data storage device 340 such as a magnetic disk or optical disc and corresponding drive may be coupled with electronic system 300.

Electronic system 300 may also be coupled via bus 305 to display device 350, such as a cathode ray tube (CRT) or liquid crystal display (LCD), to display information to a user. Alphanumeric input device 360, including alphanumeric and other keys, may be coupled to bus 305 to communicate information and command selections to processor 310. Another type of user input device is cursor control 370, such as a mouse, a trackball, or cursor direction keys to communicate information and command selections to processor 310 and to control cursor movement on display 350.

Electronic system 300 further may include one or more network interfaces 380 to provide access to network, such as a local area network. Network interface 380 may include, for example, a wireless network interface having antenna 385, which may represent one or more antennae. Network interface 380 may also include, for example, a wired network interface to communicate with remote devices via network cable 387, which may be, for example, an Ethernet cable, a coaxial cable, a fiber optic cable, a serial cable, or a parallel cable.

In one embodiment, network interface 380 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 380 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In an embodiment, a system 300 includes one or more omnidirectional antennae 385, which may refer to an antenna that is at least partially omnidirectional and/or substantially omnidirectional, and a processor 310 coupled to communicate via the antennae.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined entirely by the following claims, which are to be construed in accordance with established doctrines of claim interpretation.

What is claimed is:

1. An apparatus, comprising:

a semiconductor substrate; and one or more fins of a multi-gate transistor device coupled with the semiconductor substrate, the one or more fins comprising a gate region, a source region, and a drain region, the gate region being disposed between the source and drain regions, wherein the gate region of the one or more fins comprises a semiconductor material, and wherein the source and drain regions of the one or more fins comprise a metal portion and a semiconductor portion, the metal portion being coupled to the semiconductor portion on a surface of the semiconductor portion that is not coupled to the semiconductor substrate, and the metal portion not being coupled to the semiconductor substrate.

2. An apparatus according to claim 1, wherein the semiconductor substrate is coupled with the semiconductor portion of the source and drain regions of the one or more fins underneath where the semiconductor portion of the source and drain regions are coupled with the metal portion.

3. An apparatus according to claim 1, wherein the metal portion of the source and drain regions is disposed on the semiconductor portion so that an electrical conductivity of the combination of the semiconductor portion and the metal portion in the source and drain regions is increased in comparison the electrical conductivity of just the semiconductor portion of the source and drain regions.

4. An apparatus according to claim 1, wherein the metal portion is formed by a replacement process, the metal portion comprising aluminum, titanium, cobalt, gold, silver, platinum, nickel, alloys or combinations thereof.

5. An apparatus according to claim 1, further comprising a gate stack coupled with the gate region of the one or more fins, wherein the gate stack comprises:

a gate dielectric film coupled with the one or more fins;

a first gate electrode comprising metal coupled with the gate dielectric film; and a second gate electrode comprising polysilicon coupled with the first gate electrode.

6. An apparatus according to claim 1, wherein the semiconductor material and the semiconductor portion comprise silicon.

7. An apparatus according to claim 1, wherein the multi-gate transistor device is a tri-gate device comprising reduced external resistance ($R_{ext}$) in comparison to a tri-gate device comprising only the semiconductor material in the source and drain regions.

8. An apparatus according to claim 2, wherein the metal portion of the source and drain regions is disposed on the semiconductor portion so that an electrical conductivity of the semiconductor portion and the metal portion in the source and drain regions in combination is increased in comparison the electrical conductivity of just the semiconductor portion of the source and drain regions.

9. An apparatus according to claim 8, wherein the metal portion is formed by a replacement process, the metal portion comprising aluminum, titanium, cobalt, gold, silver, platinum, nickel, alloys or combinations thereof.

10. An apparatus according to claim 9, further comprising a gate stack coupled with the gate region of the one or more fins, wherein the gate stack comprises:

a gate dielectric film coupled with the one or more fins;

a first gate electrode comprising metal coupled with the gate dielectric film; and a second gate electrode comprising polysilicon coupled with the first gate electrode.

11. An apparatus according to claim 10, wherein the semiconductor material and the semiconductor portion comprise silicon.

12. An apparatus according to claim 11, wherein the multi-gate transistor device is a tri-gate device comprising reduced external resistance ($R_{ext}$) in comparison to a tri-gate device comprising only the semiconductor material in the source and drain regions.

* * * * *